United States Patent

Robinson, Jr. et al.

[11] Patent Number: 5,827,757
[45] Date of Patent: Oct. 27, 1998

[54] FABRICATION OF LARGE AREA X-RAY IMAGE CAPTURING ELEMENT

[75] Inventors: George D. Robinson, Jr., Sewell, N.J.; Joseph A. Perrotto, Landenberg, Pa.; Lothar S. Jeromin, Newark; James E. Davis, Wilmington, both of Del.

[73] Assignee: Direct Radiography Corp., Newark, Del.

[21] Appl. No.: 680,951

[22] Filed: Jul. 16, 1996

[51] Int. Cl.[6] .................................................. H01L 27/14
[52] U.S. Cl. ................................ 438/73; 438/66; 438/68; 438/69
[58] Field of Search ............................... 250/370.09, 580, 250/370.11; 257/444, 65; 438/66, 67, 68, 69, 57, 59, 73, 459, 455

[56] References Cited

U.S. PATENT DOCUMENTS

| | | | |
|---|---|---|---|
| 5,198,069 | 3/1993 | Zimmermann et al. | 438/67 |
| 5,220,170 | 6/1993 | Cox et al. | 250/370.09 |
| 5,273,910 | 12/1993 | Tran et al. | 438/69 |
| 5,313,066 | 5/1994 | Lee et al. | 250/370.09 |
| 5,315,101 | 5/1994 | Hughes et al. | 250/208.1 |
| 5,381,014 | 1/1995 | Jeromin et al. | 250/370.09 |
| 5,418,377 | 5/1995 | Tran et al. | 250/483.1 |
| 5,498,880 | 3/1996 | Lee et al. | 250/580 |
| 5,585,280 | 12/1996 | Kwasnick et al. | 438/69 |
| 5,598,004 | 1/1997 | Powell et al. | 250/370.09 |
| 5,635,718 | 6/1997 | De Pudt et al. | 250/370.09 |

Primary Examiner—John Niebling
Assistant Examiner—S. Mulpuri
Attorney, Agent, or Firm—Ratner & Prestia

[57] ABSTRACT

A large imaging panel useful for direct radiography is prepared from two or four discrete modules, or tiles, containing arrays of solid state pixels. In preparing the large panels, a protective layer is applied over the array of solid state pixels on each module to protect the modules during subsequent processing steps. One or two edges of each protected module is trimmed and polished to form a polished edge which is within a specified distance from the solid state pixels of the array. The polished edges typically are surface treated (e.g., by etching) to enhance wetting and adherence of applied adhesive material. Protected modules are then assembled on a flat surface to form a two-dimensional mosaic of the modules in a way that each polished edge of each module is placed adjacent to the polished edge of a neighboring module to form a gap and a precise separation between the pixels of neighboring modules which is the same as the separation between adjacent pixels of one of the modules. A curable polymeric material is applied to each gap and cured so that each gap is at least partially filled. A base plate is adhered to the mosaic by means of a curable adhesive layer which is cured. The protected mosaic array is removed intact from the flat surface and each gap between the protective layers of the mosaic is filled with the curable polymeric material to a level at least above the top surfaces of the modules, and the curable polymeric material is cured. The protective layers are then removed from each array of pixels to leave a uniform ridge of cured polymeric material corresponding to each gap. A continuous radiation detecting layer of a material such as selenium is formed over the modules to complete the large radiographic imaging panel.

28 Claims, 5 Drawing Sheets

Figure 10

FABRICATION OF LARGE AREA X-RAY IMAGE CAPTURING ELEMENT

BACKGROUND OF THE INVENTION

The present invention relates to an electronic apparatus for capturing digital radiographic images. More particularly, this invention relates to a method for fabricating a large area, x-ray image capturing element.

DESCRIPTION OF RELATED ART

Recently, systems have been developed to capture patterns of x-rays using solid state components, generally employing x-ray sensitive materials, intensifiers or photo-conductive materials to convert x-ray patterns into electrical signal patterns. These systems generally involve converting an area x-ray image pattern into a corresponding array of electrical signals that are subsequently used to produce a visible display of the captured image. Most of these systems utilize conversion elements formed from arrays of microelectronic devices. Illustrative of such conversion elements are those disclosed in Lee et al., U.S. Pat. No. 5,313,066. Lee's x-ray image capturing element comprises a panel which has a layered structure which includes a conductive layer and a plurality of access electrodes and electronic components built on the panel. The conductive layer comprises a plurality of discrete microplates which have dimensions co-extensive with an image pixel. The plurality of access electrodes and electronic components allow access to the microplates for capturing and reading out the latent radiographic image captured in the panel in the form of stored electrical charges.

Since such conversion elements are produced by manufacturing processes whose yields are drastically reduced as the size of the array increases, there are practical limitations to the maximum size of captured x-ray image pattern. Hence solid state devices that capture x-ray patterns and produce electrical representations of the pattern, cannot be readily produced in sizes large enough to capture the full size of conventional x-ray imaging fields, e.g., up to 14×17 inches as used to capture a chest x-ray image.

Efforts to overcome this size limitation have included assembling a plurality of smaller solid state x-ray detectors into a large solid state x-ray sensor which can be manufactured at reasonable yields. However additional problems were introduced such as blind non-radiation-detection areas introduced at the junctions of adjacent smaller x-ray detectors. Jeromin et al. addressed this problem in U.S. Pat. No. 5,381,014 wherein they fabricate a large area x-ray image capture element by juxtaposing a plurality of discrete array modules in an assembly over a base plate so that each module is adjacent to at least one other module to form a two-dimensional mosaic of the modules. Each module includes a plurality of thin film transistors (TFT) arrayed adjacent the top surface of a dielectric substrate and at least one precision ground edge of the substrate forms a precise abutment with a one precision ground edge of another substrate. A continuous radiation detecting layer is then disposed over the plurality of juxtaposed modules to form the large format element which minimizes or totally voids non-radiation-detecting areas between modules.

While the need for a uniform imaging surface across a completed panel has been successfully addressed by the process of Jeromin et al., a need still remains to firmly fix adjacent arrays relative to one another so that there is no relative motion during subsequent processing and during customer use, and so that no additional defects are introduced.

SUMMARY OF THE INVENTION

This need is met by the fabrication process of this invention which is a method for producing a tiled radiation detection panel from a plurality of discrete modules wherein each module comprises a planar dielectric support having a top surface and a bottom surface, and a plurality of solid state electronic components arrayed adjacent the top surface to form an array of solid state pixels; the method comprising:

A) applying a protective layer over the array of solid state pixels on each module to form a protected module;

B) polishing at least one edge of each protected module to form a polished edge which is within a specified distance from the solid state pixels of the array;

C) assembling the plurality of protected modules to form a two-dimensional mosaic of the modules on a flat surface, wherein the protective layer of each protected module is in contact with the flat surface and wherein each polished edge of each protected module is adjacent to the polished edge of a neighboring protected module to form a gap between adjacent polished edges such that a distance measured between adjacent solid state pixels in adjacent modules is substantially the same as a distance measured between adjacent solid state pixels within the modules;

D) adhering a base plate to the two-dimensional mosaic through an adhesive layer located therebetween to form a protected mosaic array;

E) removing the protected mosaic array from the flat surface.

In a preferred embodiment of this invention, the method further comprises:

F) filling each gap between the adjacent polished edges of the protected mosaic array with a curable polymeric material, and curing the curable polymeric material to form a cured polymeric joint which is at least level with the top surfaces of the modules. In this embodiment, prior to adhering the base plate to the two-dimensional mosaic in step D, a curable polymeric material may be applied to each gap so that each gap is at least partially filled, and then the curable polymeric material is cured.

In a further embodiment of this invention, the at least one edge of each protected module is trimmed of excess planar dielectric support prior to polishing the at least one edge.

In still a further embodiment of this invention, after step F, the method further comprises:

G) removing the protective layers from each array of solid state pixels; and

H) forming a continuous radiation detecting layer over the plurality of modules.

In still another embodiment of this invention, each polished edge of each protected module is surface treated before step C.

BRIEF DESCRIPTION OF THE DRAWINGS

The invention can be more fully understood from the following description thereof in connection with the accompanying drawings described as follows.

DETAILED DESCRIPTION OF THE INVENTION

In order to produce a large imaging panel for direct radiography such as for chest x-ray imaging, typically four Thin Film Transistor (TFT) arrays are assembled together. The need for uniform imaging surface across the completed panel requires that each of the TFT arrays have two edges that are polished flat & straight so that they mate with adjacent arrays. The arrays must then be fixed relative to one another so that there is no relative motion during the subsequent processing and during customer use. The present invention is directed to a novel method for preparing such large imaging panels for use in direct radiography. The large imaging panel is prepared from at least two and typically four discrete modules, or tiles, containing arrays of solid state pixels such as TFT arrays. In the preparation of the large panels of this invention, a protective layer is applied over the array of solid state pixels on each module to form a protected module for the subsequent processing steps. Then at least one edge (two edges when 4 modules are used) of each protected module is trimmed and polished to form a polished edge which is within a specified distance from the solid state pixels of the array. Preferably the polished edges are surface treated (e.g., by etching) at this juncture to enhance wetting and adhesion of subsequently applied polymeric material. The protected modules are then assembled on a flat surface to form a two-dimensional mosaic of the modules. In this assembly, the protective layer of each protected module is placed in contact with the flat surface in a way that each polished edge of each protected module is placed adjacent to the polished edge of a neighboring protected module to form a gap and a precise separation between the pixels of neighboring modules. Preferably, the precise pixel separation is the separation between adjacent pixels of one of the modules such that a distance measured between adjacent solid state pixels in adjacent modules is substantially the same as a distance measured between adjacent solid state pixels within the modules. A curable polymeric material is then applied to each gap so that each gap is at least partially tilled, and the curable polymeric material is cured. A base plate is then adhered to the two-dimensional mosaic by means of a curable adhesive layer located therebetween. In this step the curable adhesive is applied initially to either the base plate or the two-dimensional mosaic. The curable adhesive layer is then cured to form a protected mosaic array which is removed intact from the flat surface. Each gap between the protective layers of the protected mosaic array is filled with the curable polymeric material to a level which is level with or above the top surfaces of the modules, and the curable polymeric material is cured. Typically, the protective layers are then removed from each array of solid state pixels to leave a uniform ridge of cured polymeric material corresponding to each gap; and a continuous radiation detecting layer is formed over the modules. Additional ancillary layers (e.g., dielectric and conductive layers) may be applied over the continuous radiation detecting layer to complete the large imaging panel. Throughout the following detailed description, similar reference characters refer to similar elements in all figures of the drawings. The figures of the drawings are representations drawn to illustrate the process of this invention and are not drawn to scale.

MODULE PREPARATION

Figure 1:
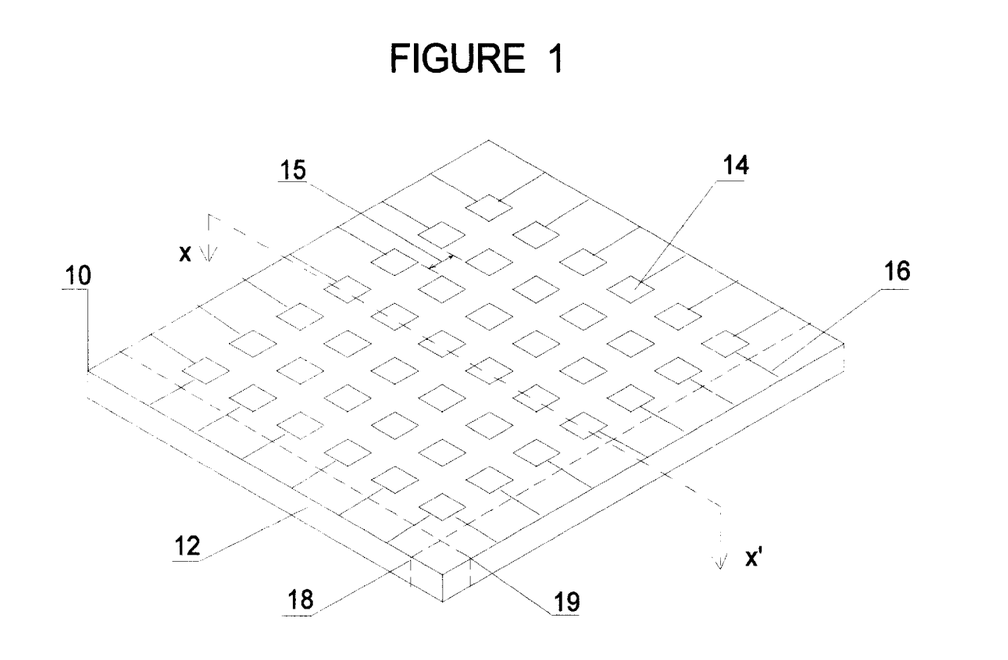
FIG. 1 is an isometric representation of a conventional thin film transistor (TFT) array module used to fabricate a large mosaic array of solid state electronic components.

Referring to FIG. 1, a conventional discrete module 10 which is used in this invention comprises a planar dielectric support 12 having a plurality of solid state electronic components arrayed adjacent the top surface to form an array of solid state pixels 14 composed of columns and rows having an interstitial distance 15 therebetween. Associated with each column and row of the array, are access electrodes 16 for processing electrical signals originating in the array pixels. While the array depicted in this figure contains only 42 pixels for illustration purposes, a typical TFT array on a 9×10×0.043 inches glass support contains a pixel array of about 1 million or more pixels 14 (e.g., 1280×1536 pattern) on about 100 to about 200 micron centers (e.g., 139 microns). The distance 15 between adjacent pixels (i.e., the intervening area free of individual pixel components or the interstitial distance between rows or columns) typically is between about 30 and about 40 microns. The solid state pixels may be any TFT component array typically used in a radiographic system. Thus the TFT array may be used with an overlying radiation sensitive layer in a transistor-capacitor system as described in Lee et al., U.S. Pat. No. 5,313,066, the disclosure of which is incorporated herein by reference. Alternatively, the TFT array may be used with an overlying radiation sensitive phosphor layer in a transistor-photodiode system as described in Jeromin et al. in U.S. Pat. No. 5,381,014, the disclosure of which is incorporated herein by reference. The planar dielectric support 12 typically is glass sheet although other sheet materials may be used such as quartz, polymers, e.g., polycarbonate, polyethylene terephthalate, composites, and the like. The present invention will be described herein in reference to preparation of large area x-ray image capturing elements of the glass supported, transistor-capacitor type of Lee et al., but is not intended to be limited thereby. Likewise, the present invention will be described herein in reference to preparation of a 14×17 inches Hat panel from four TFT arrays on 7.25× 8.6×0.043 inches glass supports each containing a pixel array having a 1280×1536 pattern of pixels on 139 micron centers and having a distance 15 between adjacent pixels (i.e., between adjacent rows or columns of pixels) of 30 microns, but is not intended to be limited thereby.

Since the pixel array 14 is surrounded on all four sides by access electrodes 16, at least one set of electrodes 16 must be trimmed along the line 18. To prevent damage to the pixels, the trimmed edge of the glass support 12 must be chip free. To prevent such damage the edge is polished to form a polished edge which is within a specified distance from the solid state pixels 14 of the array. The specified distance is less than one half the distance 15 between adjacent pixels and preferably one third the distance 15 (e.g., for a distance 15 of 30 microns, the glass is polished to within 5 microns of the pixel array. When only two modules are to be joined into a two panel mosaic array, only one set of electrodes 16 for each module is trimmed along the line 18 and polished. Typically four modules are joined into a four panel mosaic array which requires that two sets of contact pads must be removed and each module trimmed along the lines 18 and 19 or along complimentary edges, and polished to form four trimmed modules with mating polished edges. Except for the choice of edges to be joined, the trimming and polishing operations, as well as subsequent operations, are the same for joining two modules or four modules. Accordingly, disclosure hereinafter is directed concurrently to both two module and four module mosaic arrays unless specifically stated otherwise.

Figure 2:
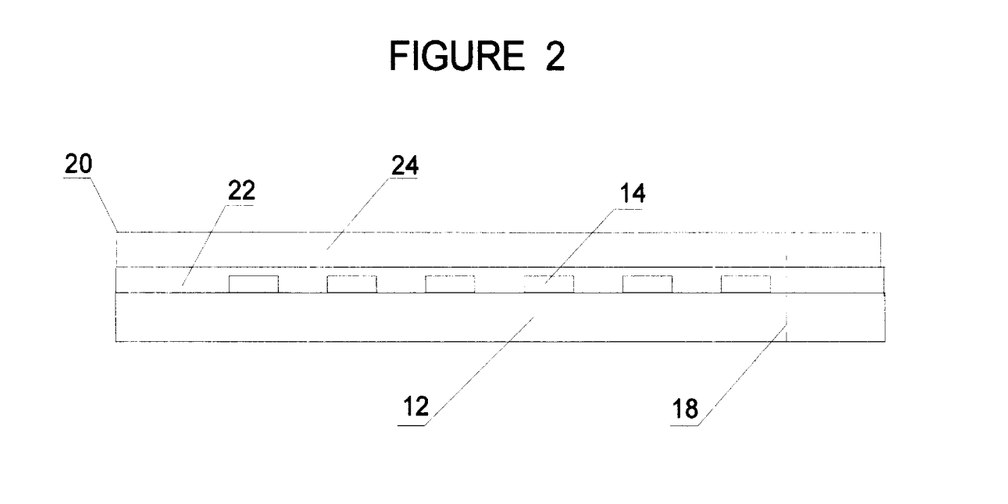
FIG. 2 is a schematic cross-sectional representation of an end section of the conventional TFT array module containing a protective layer and a protective cover-sheet over the array and depicting the line where the module is to be trimmed.

Prior to the trimming and polishing steps of this preparation one or more protective layers are applied over the array of solid state pixels on each module to form the protected module represented in the FIG. 2 which is a schematic cross-sectional representation of the end section taken at x-x'plane of the TFT array module of FIG. 1. In FIG. 2, the protected module 20 contains a first protective layer 22 which covers the pixel array 14 and the glass substrate 12. A second protective layer in the form of a preformed, removable cover-sheet 24 is present over the first protective layer 22. The line 18 depicts where the module is to be trimmed and polished. Both protective layers function to protect the pixel array 14 from physical, electrostatic and chemical damage during manipulation and treatment in the following steps of the preparation. The removable cover-sheet 24 primarily functions to protect module 20 during trimming, polishing and surface treatment steps after which it typically is removed. The first protective layer 22 functions as a thin resist layer to protect the pixel array 14 in subsequent preparation steps during manipulation and application of polymeric adhesives. The first protective layer 22 typically is removed prior to coating with a continuous radiation detection layer. The protective layers may be applied individually or as a preformed dry laminate. When the layers are applied individually, the first protective layer 22 may be applied by any conventional coating means. Typically this layer is spincoated with a polymeric material (e.g., OCG 510-90 protective resin, a product of OCG Microelectronics Materials, Inc., Tempe, Ariz.) to provide a 1–7 micron thick layer of polymer upon removal of any coating solvent. The polymer layer is then baked on at 90° C. for 30 minutes to remove any residual solvent. The second protective layer 24 may be applied by any conventional means including coating means. Typically this layer is a preformed plastic film such as polyvinyl chloride, polyethylene terephthalate, polyethylene, polypropylene, and the like. The preformed plastic film typically has a thickness of about 50 microns to about 100 microns, such as Wafer Handling Film #1003 (a high-tack, PVC film product of Ultron Systems, Inc., Moorpark, Calif.) which has a thickness of 120 micron. The preformed plastic film typically is laminated to the surface of the first protective layer 22 using heat and/or pressure such as with a Model UH108 wafer film applicator using pressure with no heat. The preformed film is chosen so that the second protective layer 24 is readily removable from the surface of the first protective layer 22 without damage thereto. Alternatively, the protective layers may be applied as a preformed dry film laminate. Typical dry film laminates consist of a temporary support film (e.g. polyethylene terephthalate) having coated thereon a dry layer of photoresist material having a thickness of about 25 microns to about 50 microns, such as Riston® photoresist films (a product of the DuPont Company, Wilmington, Del.). The preformed dry film laminate typically is laminated under heat and pressure so that the layer of photoresist material closely conforms to the surfaces of the pixel array 14 and glass substrate 12 to form the first protective layer 22 with the temporary support film forming the second protective layer 24. Typically, the photoresist material is hardened by UV radiation exposure to allow subsequent easy removal of second protective layer 24 from the first layer 22.

Figure 3:
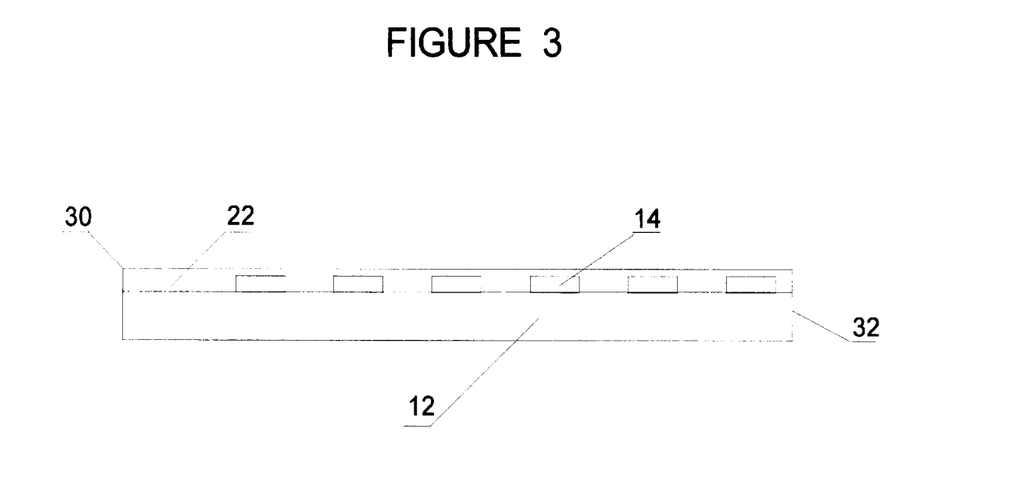
FIG. 3 is a schematic cross-sectional representation of the protected TFT array module which has been trimmed and polished and wherein the cover-sheet has been removed.

At least one edge of each protected module 20 is polished to form a polished edge which is within a specified distance from the solid state pixels of the array, i.e. within one half the distance 15 between pixels 14 of the array along line 18 of FIGS. 1 and 2. When four panels are to be joined two adjoining sets of electrodes are removed along lines 18 and 19. This trimming process involves dicing excess glass off two sides of each protected module 20 with a diamond dicing saw. Since this dicing operation produces chips approximately 60 microns deep, the glass is diced 125 microns from the first row of the pixels 14. An alternate operation to dicing is to scribe and break. Since scribing produces chips about 20 microns deep the glass can be scribed 60 microns from the first row of pixels 14. Due to the way they are fitted together, the protected modules 20 must be diced in a right and left hand version. Whatever process is used to trim the glass to size, if any, polishing is required to bring the edge of the glass to within the specified distance, such as 5 microns of the pixels 14. Although any means may be used to polish the edges to the specified distance, a preferred method uses the polishing apparatus disclosed in assignee's co-pending U.S. patent application Ser. No. 08/680,952 filed on even date herewith, which Application is incorporated herein by reference. In this preferred polishing method, each protected module is rigidly mounted to a large stainless steel block in such a way that a trimmed glass edge of the module protrudes down from the block a preset distance. This block is mounted on slide bearings that allow it to move vertically on slide journal posts fixed orthogonally to a top surface of a steel ring. The bottom surface of the ring rides on the surface of a 36 or 48 inches diameter polishing wheel so that the module is held perpendicular to the polishing wheel surface. The polishing wheel is a flat, cast iron wheel having a polyurethane surface pad and is used with a colloidal silica polishing solution. As the wheel spins the fixture rotates inside of a conditioning ring which maintains a flat polishing surface and acts to keep the module/fixture rotating properly. As the module edge is polished, the module and block slowly lower and maintain contact with the polishing wheel. When the module edge has been polished even with the bottom surface of the block, polishing rate slows significantly and the polishing process is complete. To set the distance the module edge protrudes from the block and thus the amount to he removed by polishing, the module is engaged at its top by two precision micrometers. By measuring the edge of the pixel distance under a microscope the amount to be polished can be accurately determined and dialed into the micrometers which forces the module edge to protrude the proper amount. Once the edges have been polished, the edges typically are surface treated to improve wetting and adhesion to subsequently applied polymeric material. While any conventional surface treatment may be used, etching of the edges with hydrofluoric acid or a salt thereof such as ammonium bifluoride is preferred, e.g., treatment with a 10% hydrofluoric acid solution for 2 minutes. Alternatively, the polished edges may be treated with a silane such as 3-aminopropyltriethoxysilane (CAS 919-30-2) or 3-glycidoxypropyltrimethoxysilane (CAS 2530-83-8). In this alternate treatment, after the modules have been polished, thoroughly cleaned and dried, a solution of 3% by weight silane in toluene is wiped on the polished edges and allowed to dry at room temperature for at least 10 minutes before proceeding to the next operation. After polishing and any surface treatment operation is complete, typically the second protective layer 24 is removed to form the protected TFT array module represented in FIG. 3. FIG. 3 is a cross sectional representation of a protected TFT array module 30 having a polished edge 32 and a protective layer 22 over the pixel array 14 and glass substrate 12. Four complimentary protected TFT array modules 30 prepared by this polishing method are ready for assembly into a single large mosaic array.

ASSEMBLY

Figure 4:
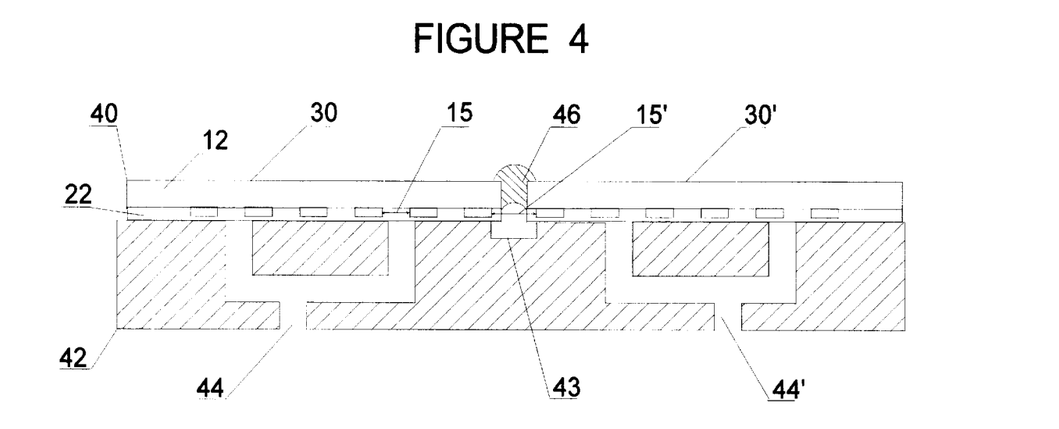
FIG. 4 is a schematic cross-sectional representation of an assembly of two protected TFT array modules on a flat surface in which the polished surfaces of each module are adjacent to provide a precise pixel separation and to form a gap which is partially filled with a bead of cured polymeric material.

The plurality of protected modules 30 are next assembled to form a two-dimensional mosaic of the modules 30 on a flat surface. Referring to FIG. 4, the protective layer 22 of each protected module 30 and 30' is placed in contact with the flat surface of an assembly fixture 42, such as a granite block, and aligned thereon so that each polished edge of each protected module 30 is adjacent to the polished edge of a neighboring protected module 30' to form a gap therebetween. The assembly fixture 42 contains one or two channel (s) 43 in the flat surface and the modules 30 and 30' are aligned on the flat surface so that the gap is over the channel. The channel prevents any adhesive material applied to the gap which may seep below the protective layers 22 from adhering the modules to the assembly fixture 42. Typically four protected TFT array modules 30, 30', etc. are placed face down onto a flat ground block of granite 42. This block 42 contains 4 sets of vacuum passages 44 that allow the TFT array modules 30 to be positioned one at a time and then held firmly in place. Shims (e.g., 15 micron thick foil) are placed between each array module pair (e.g., 30 and 30') to insure that there is a gap large enough to wick in a curable polymeric material and to preliminarily align the module pair. After the preliminary alignment the shims are removed and the alignment of module 30' is adjusted (using a microscope) with respect to module 30 using a microscope so that the pixels of module 30 are separated from the pixels of module 30' along the length of the gap by a precise distance 15' which virtually is the same distance as the distance 15 between adjacent pixels. The protective resin 22 covering the pixels protects them from damage during this operation. Depending on the gap filling technique to be used, the second protective layer 24 may remain in place throughout this assembly operation. In a preferred assembly operation, the second protective layer 24 is removed prior to assembly. After the TFT array modules 30 ar aligned and fixed in place by vacuum, a bead of curable polymeric material 46 may be applied to each gap so that each gap is at least partially filled. (Surprisingly, when the module edges had been surface treated with the silane described supra, the gap was uniformly filled with the curable polymeric material 46 without under or over filling, i.e., self-leveling.) While any curable polymeric material may be used, a UV curable material is preferred such as UV cure epoxy (Norland® 61 optical adhesive, a product of Norland Products, Inc., New Brunswick, N.J.). The bead of curable polymeric material 46 is then cured, e.g., by exposure to UV radiation, to join the modules 30 through a polymerized plug in each gap thereby forming a two-dimensional mosaic 40. Once the curable polymeric material is cured, any excess typically is scraped off the dielectric supports 12. The polymerized plug prevents contamination of the mosaic face and the underlying fixture from subsequently applied adhesive material.

Figure 5:
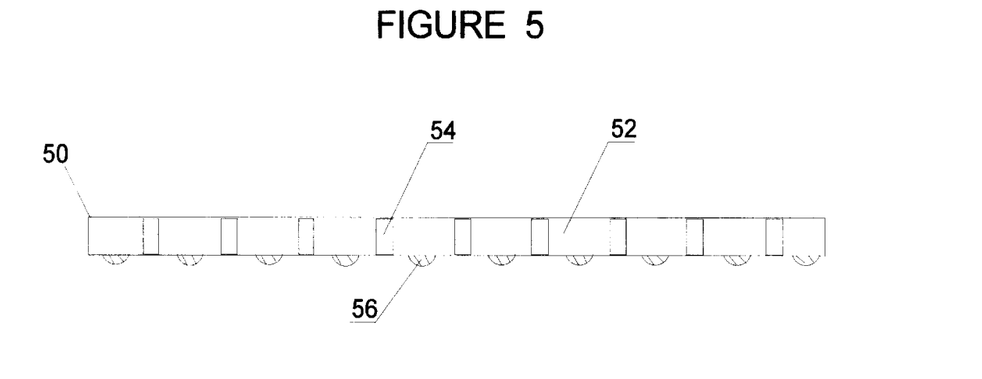
FIG. 5 is a schematic cross-sectional representation of a base plate having a plurality of holes therethrough and having beads of a curable adhesive material laid on the plate surface in a cross hatch pattern between the holes.
Figure 6:
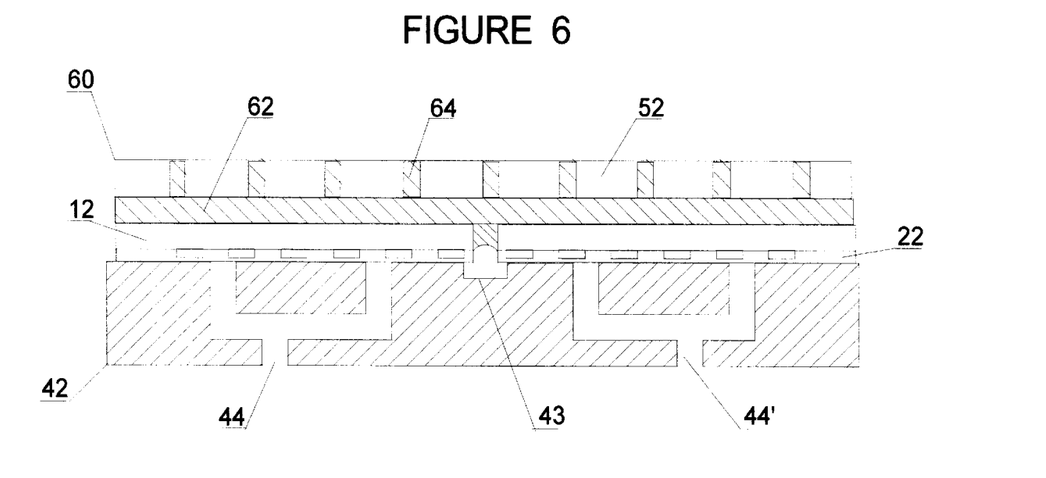
FIG. 6 is a schematic cross-sectional representation of the assembly of FIG. 4 in which a base plate of FIG. 5 is adhered to the assembly through a cured adhesive layer.

A base plate next is adhered to the two-dimensional mosaic through an adhesive layer located therebetween to form a protected mosaic array. While a simple contact adhesive may be used, preferably the adhesive layer is a curable adhesive which is cured thermally or preferably by actinic radiation such as UV radiation. Referring to FIG. 5, the base plate 52 typically is glass sheet although other sheet materials may be used such as quartz, silicon, polymers, e.g., polycarbonate, polyethylene terephthalate, composites, ceramics, metals, alloys, and the like. The base plate 52 is a rigid sheet having outer dimensions similar to the two-dimensional mosaic 40 formed in the previous operation, e.g., 14×17 inches for a four-module, two-dimensional mosaic 40. Typically the base plate 52 contains a pattern of 1 mm diameter holes 54 on 2.54 cm spacing to prevent air entrapment during the adhesion operation to the mosaic 40; and is transparent to actinic, e.g., UV, radiation to allow curing of a UV curable adhesive material. While any curable adhesive material may be used, a UV curable material is preferred such as the UV cure epoxy Norland® 61. Typically, the curable adhesive material used is the same as the curable polymeric material used in other operations of this method. Alternatively, the curable adhesive material and/or the curable polymeric material may be thermally cured, catalytically cured at room temperature, or the like (particularly when the base plate 52 is opaque to UV light). A bead of curable adhesive material 56 is placed between the holes 54 in a cross hatch pattern. The support plate 50 is then placed on the two-dimensional mosaic 40 and pressed to distribute the adhesive material and force any trapped air and excess adhesive to escape via the holes 54. The adhesive material is then cured, typically, by a uniform UV exposure through the UV transparent base plate 52, to form the protected mosaic array 60 of FIG. 6. Either prior to, or after the curing operation, any excess adhesive material exuding through the holes 54 is removed from the rear surface of the base plate. Preferably, a precise amount of adhesive is applied to the base plate 52 so that no excess adhesive escapes via the holes 54. In this instance, the need for prior application of cured polymeric material 46 to the gap is obviated. Alternatively, a contact adhesive may be applied to the support plate 50 which is then placed and adhered onto the two-dimensional mosaic 40 without the need of curing. As represented in FIG. 6, the base plate 52 is adhered to the two-dimensional mosaic through a cured adhesive layer 62 wherein the holes 64 in the base plate 52 typically are filled with cured adhesive material.

Figure 7:
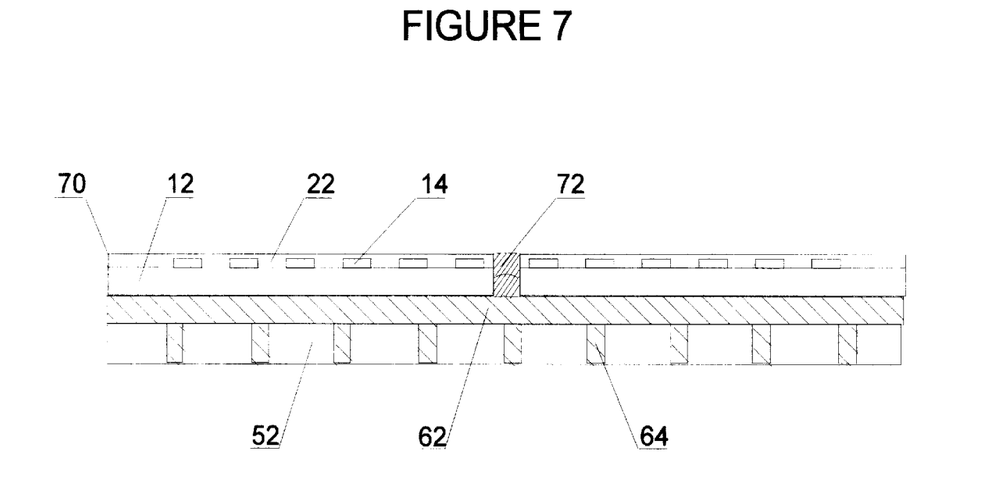
FIG. 7 is a schematic cross-sectional representation of the protected mosaic array in which the remaining gap is filled with cured polymeric material to the surfaces of the adjacent protective layers.

At this stage of the assembly, the protected mosaic array 60 is removed from the granite block, i.e., the surface of the assembly fixture 42, is flipped over, each gap in the protective layers 22 of the protected mosaic array 60 is filled with the curable polymeric material to a level at least above the top surfaces of the modules, and the curable polymeric material is cured. In this operation, referring to FIG. 7, a bead of the curable polymeric material, e.g., UV cure epoxy Norland® 61, is laid along the gaps between the modules and the curable polymeric material is planarized to the surfaces of the protective layers 22, e.g., using a rubber squeegee, so that a small amount remains to seal the gap. In this instance the protective layers 22 act as a mask to the modules during application of the polymeric material. This assembly is then placed in a vacuum chamber for 30 min. to draw out any trapped air bubbles. The polymeric material is then cured, e.g., by exposure to UV radiation. This operation may be repeated several times to insure complete filling of the gap to form the cured polymeric joint 72. After the final cure the cured polymeric material is aged at 50° C. for 12 hours.

Figure 8:
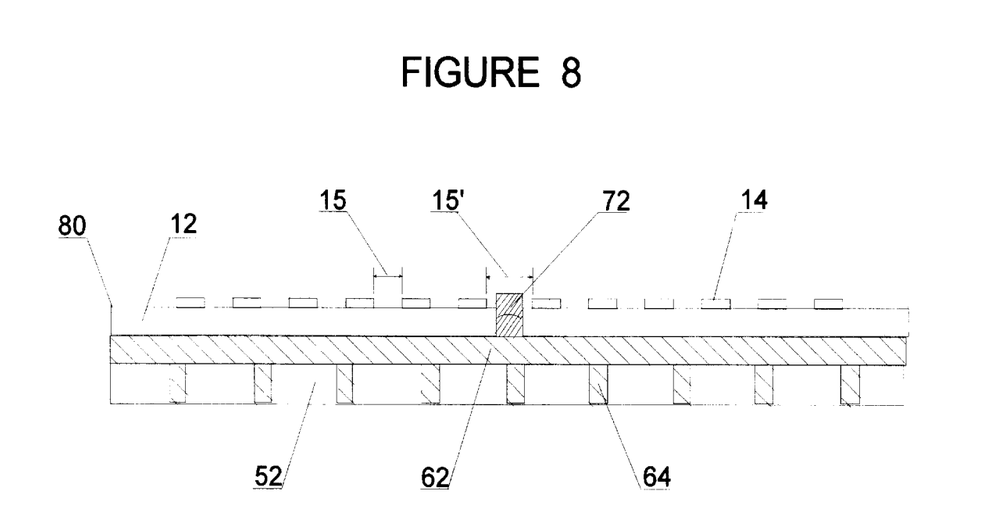
FIG. 8 is a schematic cross-sectional representation of the mosaic array wherein the protective layers have been removed from each TFT array module to leave a ridge of cured polymeric material therebetween.
Figure 9:
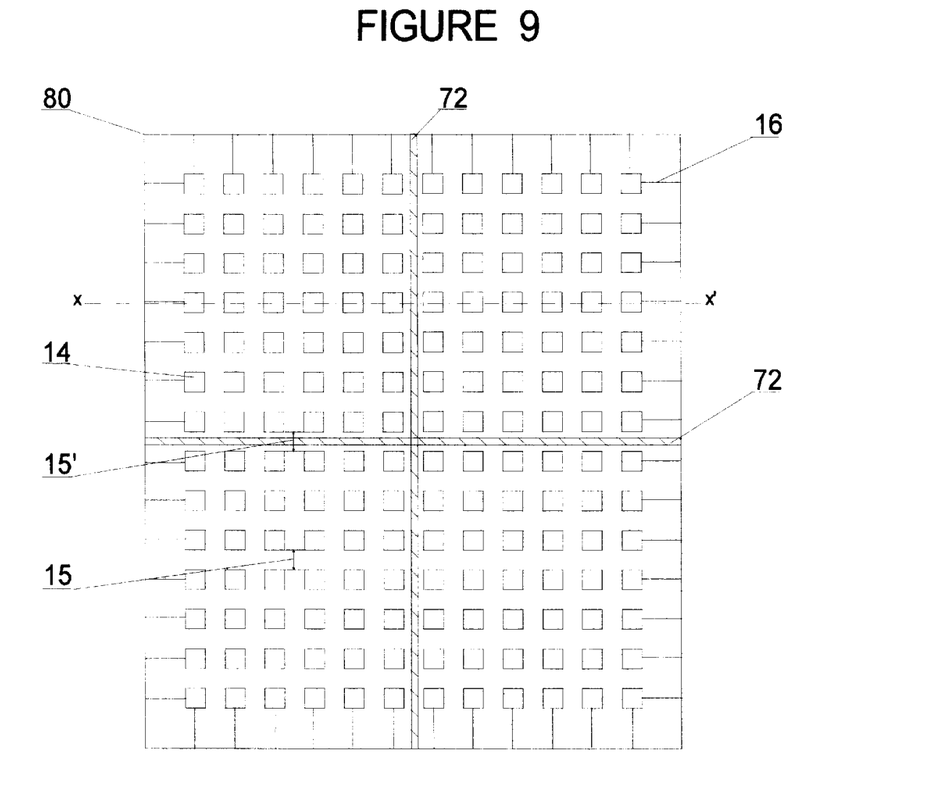
FIG. 9 is a top view representation of a four-module, mosaic array of FIG. 8.

After the polymeric material is cured and aged, the protective layers 22 are removed from each array of solid state pixels 14 to leave a uniform ridge of cured polymeric material 72 corresponding to each gap as represented in FIGS. 8 and 9 wherein a distance 15' measured between adjacent solid state pixels in adjacent modules is substantially the same as a distance 15 measured between adjacent solid state pixels within the modules. FIG. 8 is a schematic cross-sectional representation of the mosaic array 80 which is taken at the x-x' section of the top view representation of FIG. 9 of a four-module, mosaic array 80. In this operation the protective layers 22 may be removed by any conventional stripping operation, provided that operation does not attack the cured polymeric or adhesive components, or the underlying pixel array 14 of the mosaic array 80. A preferred striping operation which meets these criteria, is the treatment of the surface of the protective layers 22 with Microstrip® 2001 positive photoresist stripper, a product of OCG Microelectronics Materials, Inc., Tempe, Ariz. In this operation, the protective layers 22 are sprayed with heated (70° C.) stripper to loosen and remove most of the protective layer. The mosaic array 80 is then immersed in stripper for 4 minutes and then again sprayed with clean stripper. After the protective layers 22 have been removed, the mosaic array 80 is rinsed with deionized water for 10 minutes then with a high pressure spray of deionized water. After further immersion in 60° C. deionized water the mosaic array 80 is blown dry with nitrogen.

Figure 10:
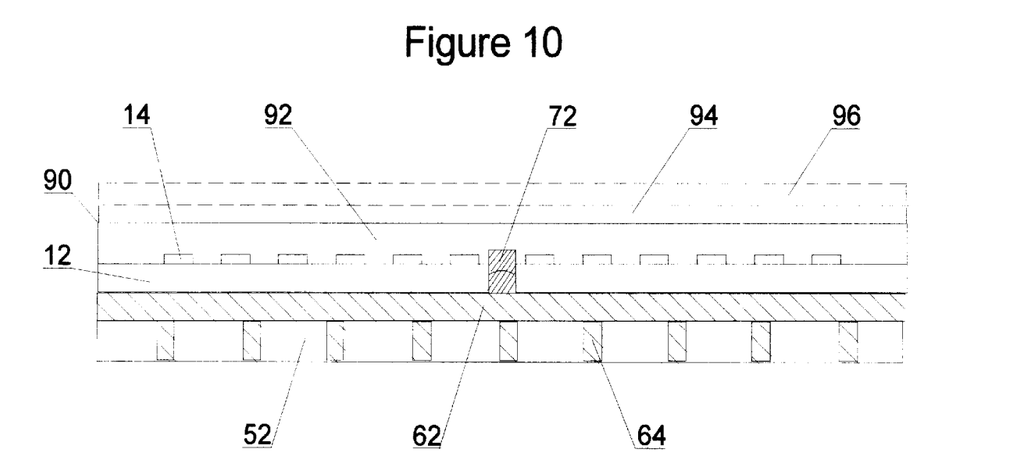
FIG. 10 is a schematic cross-sectional representation of the mosaic array of FIG. 8, wherein a continuous radiation detecting layer has been deposited over the surface of the mosaic array.

Typically a continuous radiation detecting layer is formed over the mosaic array 80 to form a direct radiographic imaging element 90 as illustrated in the schematic cross-sectional representation of FIG. 10. The continuous radiation sensitive layer 92 may function in connection with underlying TFT pixel arrays 14 in a transistor-capacitor system such as described in Lee et al., supra. In this instance, the radiation sensitive layer 92 typically is selenium or a selenium alloy, although cadmium sulfide, mercuric iodide, lead oxide, conventional phosphors, or the like could also he used. In addition to the radiation sensitive layer 92, ancillary layers such as an overlying dielectric layer 94 such as Parylene (CAS 28804-46-8) and a conductive layer 96 such as chromium (CAS 7440-47-3) are required to complete the transistor-capacitor system. These ancillary layers (shown in the FIG. 10 with dashed lines) are composed of materials and prepared in accordance with the disclosures of Lee et al. as well as Jeromin et al. supra. Alternatively, the continuous radiation sensitive layer 92 may function in connection with underlying TFT pixel arrays 14 in a transistor-photodiode system such as described in Jeromin et al., supra. In this instance, the radiation sensitive layer 92 typically is a conventional phosphor layer which converts incident x-radiation into light detectable by transistor-photdiode pixels 14 thereunder. The direct radiographic imaging element 90 may be coated or encapsulated in additional packaging layers to seal or otherwise protect the element during subsequent use and handling.

In contrast to previous systems in which the gap between modules was left partially or totally unfilled, the presence of the ridge 72 surprisingly does no induce defects into the continuous radiation sensitive layer 92, improves handling durability during subsequent use, and improves coating uniformity over the pixels along the polished edge.

Those skilled in the art having the benefit of the teachings of the present invention as hereinabove set forth, can effect numerous modifications thereto. These modifications are to be construed as being encompassed within the scope of the present invention as set forth in the appended claims.

What is claimed is:

1. A method for producing a tiled radiation detection panel from a plurality of discrete modules wherein each module comprises a planar dielectric support having a top surface and a bottom surface, and a plurality of solid state electronic components arrayed adjacent the top surface to form an array of solid state pixels; the method comprising:

A) applying a protective layer over the array of solid state pixels on each module to form a protected module;

B) trimming and polishing at least one edge of each protected module to form a polished edge which is within a specified distance from the solid state pixels of the array;

C) assembling the plurality of protected modules to form a two-dimensional mosaic of the modules on a flat surface of an assembly fixture, wherein the protective layer of each protected module is in contact with the flat surface and wherein each polished edge of each protected module is adjacent to the polished edge of a neighboring protected module to form a gap between adjacent polished edges such that a distance measured between adjacent solid state pixels in adjacent modules is substantially the same as a distance measured between adjacent solid state pixels within the modules and filling the gap with a material;

D) adhering a base plate to the two-dimensional mosaic through an adhesive layer located therebetween to form a protected mosaic array; and then E) removing the protected mosaic array from the flat surface.

2. The method of claim 1 further comprising:

F) filling each gap between the adjacent polished edges of the protected mosaic array with a curable polymeric material, and curing the curable polymeric material to form a cured polymeric joint which is at least level with the top surfaces of the modules.

3. The method of claim 2 wherein prior to adhering the base plate to the two-dimensional mosaic in step D, a curable polymeric material is applied to each gap so that each gap is at least partially filled, and then the curable polymeric material is cured.

4. The method of claim 2 further comprising:

G) removing the protective layers from each array of solid state pixels.

5. The method of claim 4 further comprising:

H) forming a continuous radiation detecting layer over the plurality of modules.

6. The method of claim 4 wherein the cured polymeric joint forms a raised uniform ridge at the location of the gap.

7. The method of claim 1 wherein the at least one edge of each protected module is trimmed of excess planar dielectric support prior to polishing the at least one edge.

8. The method of claim 7 wherein the at least one edge of each protected module is trimmed by dicing or by scribing and breaking.

9. The method of claim 1 wherein the specified distance from the solid state pixels of the array is one half the distance measured between adjacent solid state pixels within the modules.

10. The method of claim 1 wherein the gap is between about 10 microns and about 25 microns.

11. The method of claim 1 wherein the plurality of protected modules is two protected modules and wherein one edge of each protected module is polished.

12. The method of claim 1 wherein the plurality of protected modules is four protected modules and wherein two adjacent edges of each protected module are polished.

13. The method of claim 1 wherein after step B and before step C, each polished edge of each protected module is surface treated.

14. The method of claim 13 wherein each polished edge of each protected module is surface treated with an etchant.

15. The method of claim 14 wherein the etchant is hydrofluoric acid or a salt thereof.

16. The method of claim 13 wherein each polished edge of each protected module is surface treated with a silane.

17. The method of claim 16 wherein the silane is 3-aminopropyltriethoxysilane or 3-glycidoxypropyltrimethoxysilane.

18. The method of claim 1 wherein the planar dielectric support is glass.

19. The method of claim 1 wherein the array of solid state pixels is a thin film transistor array of a transistor-capacitor system.

20. The method of claim 1 wherein the array of solid state pixels is a thin film transistor array of a transistor-photodiode system.

21. The method of claim 1 wherein the base plate contains a pattern of holes.

22. The method of claim 21 wherein a curable adhesive material is applied to the base plate in a cross-hatch pattern between holes of the pattern of holes, and the base plate is applied to the two-dimensional mosaic to form the curable adhesive layer.

23. The method of claim 1 wherein the protective layer comprises a polymeric coversheet and a polymeric masking layer and wherein the protective layer is applied so that the polymeric masking layer is between the polymeric coversheet and the array of solid state pixels on each module.

24. The method of claim 2 wherein the protective layer comprises a polymeric coversheet and a polymeric masking layer and wherein the protective layer is applied so that the polymeric masking layer is between the polymeric coversheet and the array of solid state pixels on each module; and wherein during step F each polymeric cover sheet is removed from each polymeric masking layer before the filling of each gap with the curable polymeric material.

25. The method of claim 1 wherein the base plate is glass.

26. The method of claim 5 wherein the continuous radiation detecting layer comprises selenium.

27. The method of claim 5 wherein the continuous radiation detecting layer comprises a phosphor.

28. The method of claim 5 wherein continuous ancillary layers are applied to the continuous radiation detecting layer.

* * * * *